(12) United States Patent
Chabas

(10) Patent No.: US 6,329,847 B1
(45) Date of Patent: Dec. 11, 2001

(54) RADIO DEVICE INCLUDING A FREQUENCY SYNTHESIZER AND PHASE DISCRIMINATOR FOR SUCH A DEVICE

(75) Inventor: Jean Alain Chabas, Cesson Sevigne (FR)

(73) Assignee: U.S. Phillips Corporation, New York, NY (US)

( * ) Notice: Subject to any disclaimer, the term of this patent is extended or adjusted under 35 U.S.C. 154(b) by 0 days.

(21) Appl. No.: 09/400,761

(22) Filed: Sep. 21, 1999

(30) Foreign Application Priority Data

Sep. 29, 1998 (FR) .................................... 9812162

(51) Int. Cl.[7] ............................................... H03D 13/00
(52) U.S. Cl. ............................................. 327/3; 327/7
(58) Field of Search ........................... 327/3, 7, 8, 10, 327/12, 5, 107

(56) References Cited

U.S. PATENT DOCUMENTS

| | | | |
|---|---|---|---|
| 6,100,721 | * 8/2000 | Durec et al. | 327/3 |
| 6,140,853 | * 10/2000 | Lo | 327/157 |
| 6,157,218 | * 12/2000 | Chen | 327/7 |

FOREIGN PATENT DOCUMENTS

| | | | | |
|---|---|---|---|---|
| 0500014B1 | 8/1992 | (EP) | ............... | H03L/7/089 |
| 0316543B1 | 10/1993 | (EP) | ............... | H03L/7/08 |
| 2343368 | 2/1977 | (FR) | ............... | H03K/5/18 |
| 1534233 | 11/1978 | (GB) | ............... | H03D/13/00 |
| 2161660A | 1/1986 | (GB) | ............... | H03D/13/00 |

* cited by examiner

*Primary Examiner*—Tuan T. Lam
*Assistant Examiner*—Hiep Nguyen
(74) *Attorney, Agent, or Firm*—Dicran Halajian

(57) ABSTRACT

A radio device includes phase discriminator with a phase locked loop. Where when there is no phase locking, the output voltage of the phase discriminator remains constant, which provides considerable gain for loop. When there is phase locking, the phase discriminator produces an error proportional to the phase difference. An output of the phase discriminator has a constant amplitude with an input signal and a reference signal have different frequencies.

13 Claims, 3 Drawing Sheets

RADIO DEVICE INCLUDING A FREQUENCY SYNTHESIZER AND PHASE DISCRIMINATOR FOR SUCH A DEVICE

FIELD OF THE INVENTION

The present invention relates to a radio device comprising a frequency synthesizer that notably includes a phase discriminator for comparing the phase of a first signal with the phase of a second signal, the phase discriminator being formed by a first sequential circuit for producing output signals that represent the phase difference between said first and second signals.

The invention also relates to such a discriminator and a process for comparing the various phase levels of two signals.

BACKGROUND OF THE INVENTION

Such devices are well known and find many applications, notably in the field of portable telephones that use a great many frequency channels determined by the synthesizer. It will be recollected that a synthesizer is formed, in essence, by a voltage-controlled variable oscillator slaved to a reference frequency after a frequency division that ultimately determines the output frequency of the synthesizer.

When the device is in the stand-by mode, it is more or less periodically to be connected to the network and, for reasons of saving energy, it is desirable for the synthesizer to be longest possible in the state of rest, that is, that this implies that the variable oscillator is synchronized with the reference frequency in the fastest possible way. One of the elements that enable to obtain a fast synchronization is the phase discriminator. In patent document EP 0 500 014 the description of such a discriminator can be found.

If this known discriminator offers good indications as regards the phase differences between −π and +π, these indications are no longer sufficient for greater phase differences, thus for signals having different frequencies.

SUMMARY OF THE INVENTION

The invention proposes a device in which the discriminator features a good characteristic of the phase level, so as to notably obtain a fast synchronization of the variable oscillator.

Therefore, such a device is characterized in that the discriminator includes a second sequential circuit for producing a constant signal when said first and second signals have different frequencies.

Thus, thanks to the invention, when the frequencies of the signals are different, the DC signal whose value is equal to a maximum permits the rapid correction of the frequency of the voltage-controlled oscillator to obtain the synchronization of the oscillator in the fastest way.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF PREFERRED EMBODIMENTS

Figure 1:
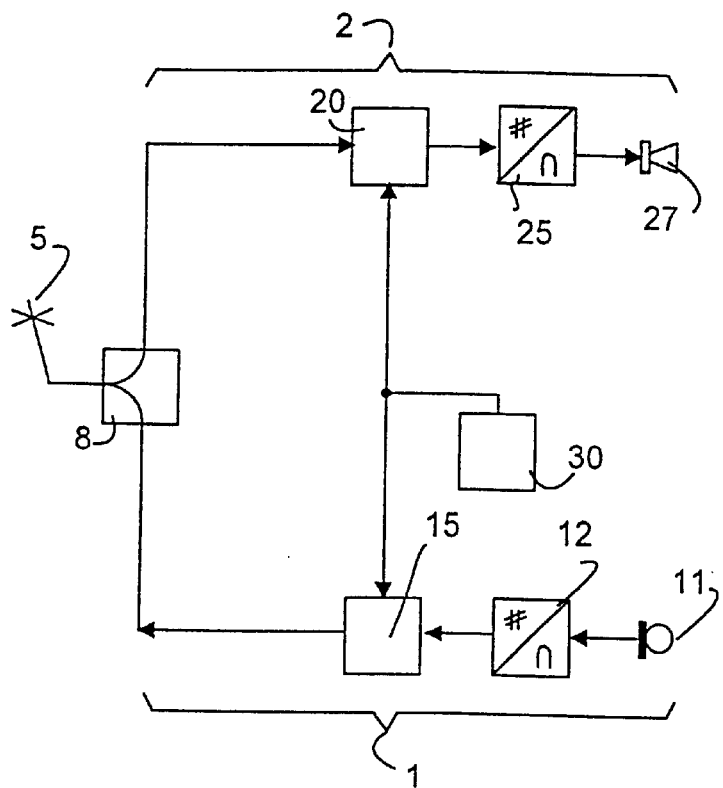
FIG. 1 shows a device in accordance with the invention.

In FIG. 1 is represented a radio device in accordance with the invention. It is formed by a transmission circuit 1 and a receiving circuit 2 coupled to an antenna 5 via a duplexer 8. The transmission circuit 1 is formed by a microphone 11, followed by an analog/digital converter 12 which produces the speech signals to be transmitted to a modulation system 15. The receiving circuit 2 is formed by a demodulation system 20, followed by a decoder 25 and a loudspeaker 27. The receiving and transmission systems are controlled via the frequency channel by means of a synthesizer 30.

Figure 2:
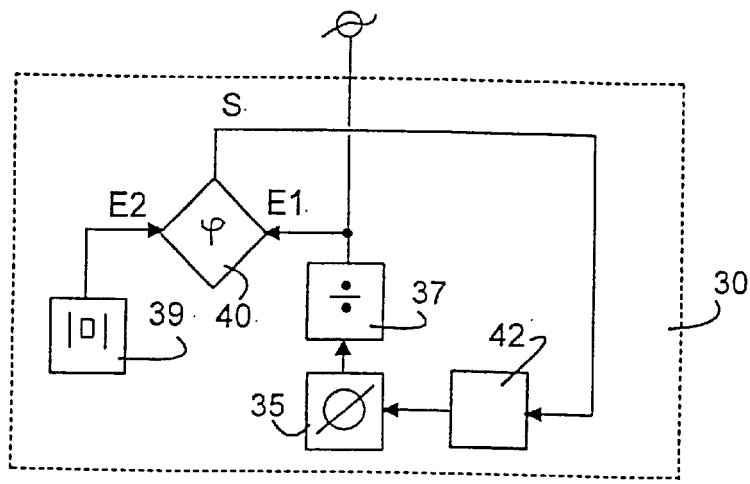
FIG. 2 shows the diagram of a synthesizer forming part of the device shown in FIG. 1.

FIG. 2 shows the structure of the synthesizer 30 of a conventional type. It is formed by a voltage-controlled oscillator 35 whose signals are frequency-divided by a frequency divider 37. The frequency division rate determines the frequency channel on which the transport will take place. The signal E1, which is the output signal of the divider 37, is compared by a phase discriminator 40 with a signal E2, which is the output signal of a quartz crystal oscillator 39. The output signal S of this discriminator is applied to the voltage-controlled oscillator 35 via a control filter 42.

Figure 3:
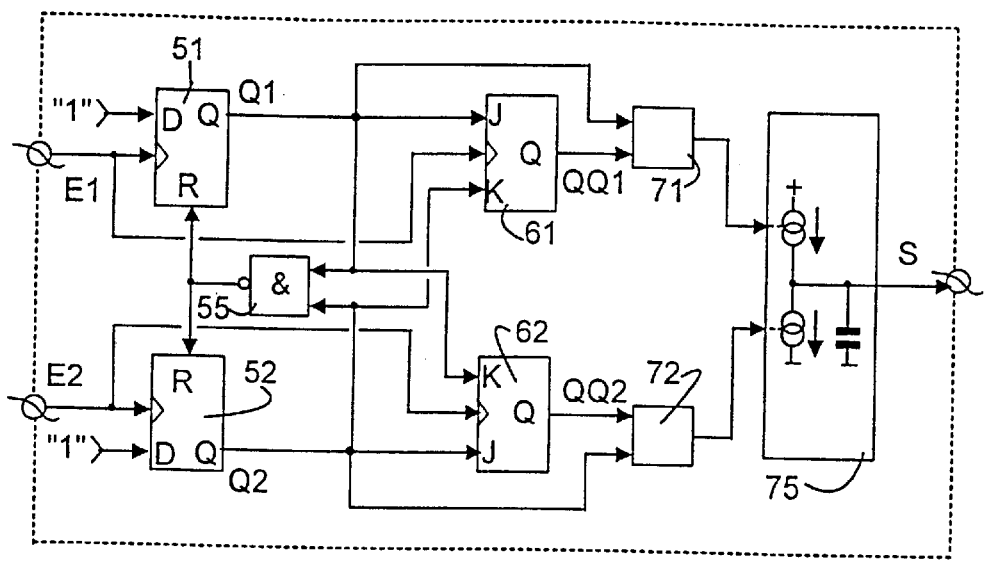
FIG. 3 shows the diagram of a discriminator that forms part of the synthesizer shown in FIG. 2.

FIG. 3 shows in detail the phase discriminator according to the invention.

The signals E1 and E2 are applied to the clock inputs of two D-type flip-flops referenced 51 and 52, respectively. These flip-flops permanently receive a signal having the logic "1" value on their input D, whereas the input R receives the output signal of a NAND gate 55. The output signals Q1 and Q2 of these flip-flops 51 and 52 are applied not only to the inputs of the gate 55, but also to the inputs J of the flip-flops 61 and 62 of the type JK, to the inputs K of the flip-flops 61 and 62 and to the first inputs of the OR gates 71 and 72. The outputs of these flip-flops 61 and 62 are applied to the inputs of a circuit known by the name of current pump 75 of a conventional type. The second inputs of these gates 71 and 72 are connected to the outputs of the latter flip-flops 61 and 62. The clock inputs of the flip-flops 61 and 62 receive the respective signals E1 and E2 and their output Q produces the signals QQ1 and QQ2, respectively.

In brief, this discriminator comprises a first sequential circuit formed by the flip-flops 51 and 52 which has the structure of known phase discriminators, a second sequential circuit formed by the flip-flops 61 and 62 and a coupling circuit mainly formed by the OR gates 71 and 72, which coupling circuit enables to feed control signals to the current pump from these sequential circuits.

Figure 4:
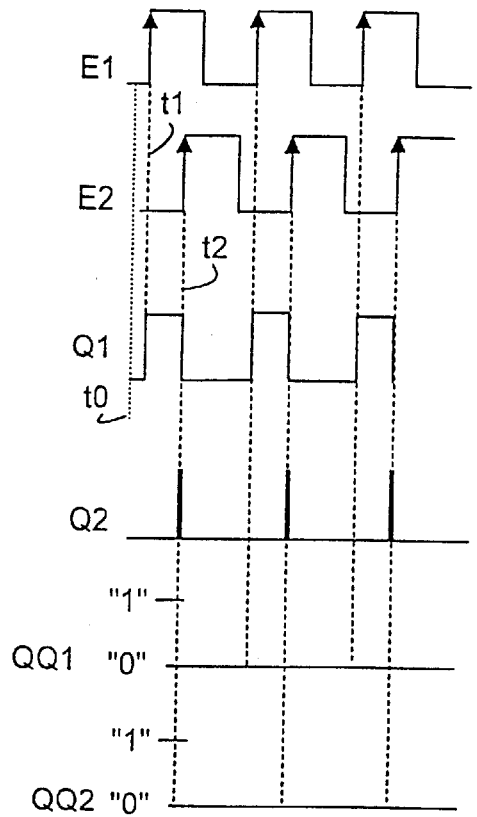
FIG. 4 is a first timing diagram intended for the explanation of the discriminator shown in FIG. 3.

The operation of the discriminator is explained for a first embodiment with the aid of FIG. 4. This mode relates to the case where the signals E1 and E2 have the same frequency. One starts from instant t0 and considers that the signals Q1 and Q2 on the outputs of the flip-flops are in the logic "0" state. At the instant t1 the low-to-high transition of the signal E1 occurs to which the flip-flops are sensitive, so that the flip-flop 51 transfers the "1" value, which was present on its input D, to its output Q. The signal Q1 then assumes the "1" value. At the instant t2 it is the rising edge of the signal E2 that occurs, which makes that the signal Q2 on the output of the flip-flop 52 assumes the "1" value. But this state changes because of the fact that an active signal coming from the gate 55 having values "0" is applied to the inputs R of the flip-flops 51 and 52. Thus after the instant t2, the signals Q1 and Q2 assume the "0" value.

As regards the flip-flops 61 and 62, it should be observed that before the active transitions of the signal E1, the signal Q1 has the "0" value and the signal Q2 the "0" value, which makes that the signal QQ1 retains its value. It should also be observed that before the active transitions of the signal E2, the signal Q1 has the "1" value and the signal Q2 the "0" value, which makes that the signal QQ2 assumes the "0" value. Thus, the OR gates 71 and 72 are open and the operation of the discriminator remains that of the prior-art discriminators.

Figure 5:
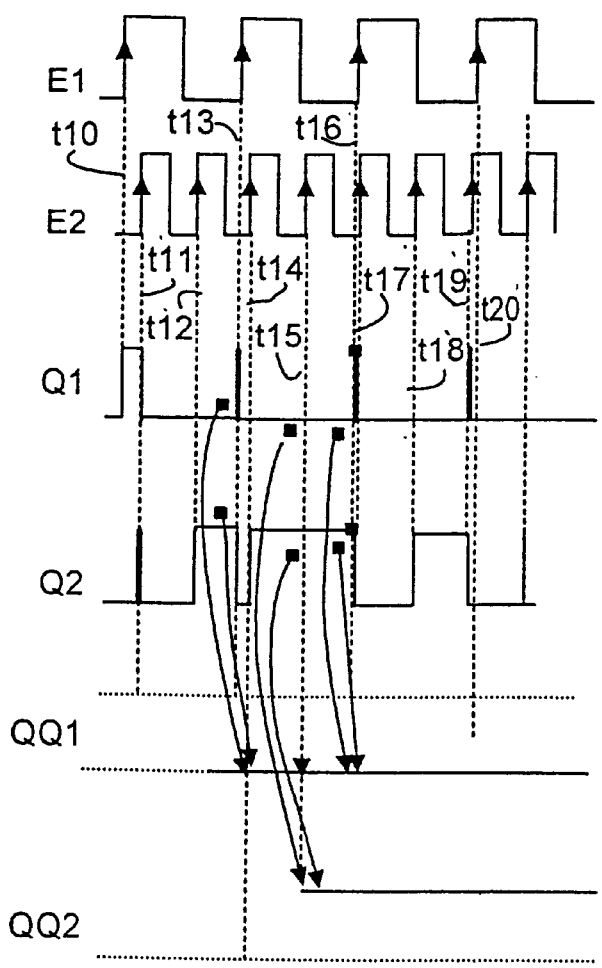
FIG. 5 is a second timing diagram intended for the explanation of the discriminator shown in FIG. 3.

The operation of the discriminator according to another embodiment, for which the signals have different frequencies, is explained with the aid of FIG. 5. Thus in this Figure, between a first transition of the signal E1 that occurs at instant t10 and a second transition of this same signal, there are two transitions of the signal E2 which appear at the instants t11 and t12. As the transition of E2 occurring at the instant t11 comes later than at the instant t10, one is thus certain that at the instant t12 the signals Q1 and Q2 have the "0" value. Thus, after this instant t12 one has Q2="1" and Q1="0", so that at instant t13, where an active transition of E1 appears, Q1 assumes the "1" value and soon loses it due to the output signal of the gate 55. After this instant t13, the signal QQ1 assumes the "0" value.

After that, at instant t14, the active edge of the signal E2 occurs, which edge will influence the flip-flops 52 and 62, the signal Q2 will change from the "0" value to the "1" value and because of this fact the signal QQ2 will have the "1" value.

At the instant t15 another active edge of the signal E2 occurs, the signal Q2 retains its "1" value, whereas the signal QQ2 keeps its "1" value.

At the instant t16, an active edge of the signal E1 occurs this time. Thus, the signal Q1 assumes the "1" value and loses it soon because the NAND gate is rendered conductive by the signal Q2. Signal QQ1 retains the "0" value acquired during the instant t13, because on its inputs J and K it receives the signals "0" and "0", respectively.

At the instant t17 a rising edge of the signal E2 occurs. It is admitted that this edge occurs after the transient rise of the signal Q1, so that at the inputs J and K of the flip-flop 62 there are the signals "0" and "0", thus the flip-flop keeps its state prior to the instant t17. At the instant t18, which is the instant at which a rising edge of the signal E2 occurs, the signal QQ2 still keeps the "1" value. The same state remains for this signal at the instant t19 where there is still a rising edge of the signal E2. Before the instant t20, the signals at the inputs J and K of the flip-flop 62 had the respective values "0" and "1", which keeps the signal QQ1 at "0".

Figure 6:
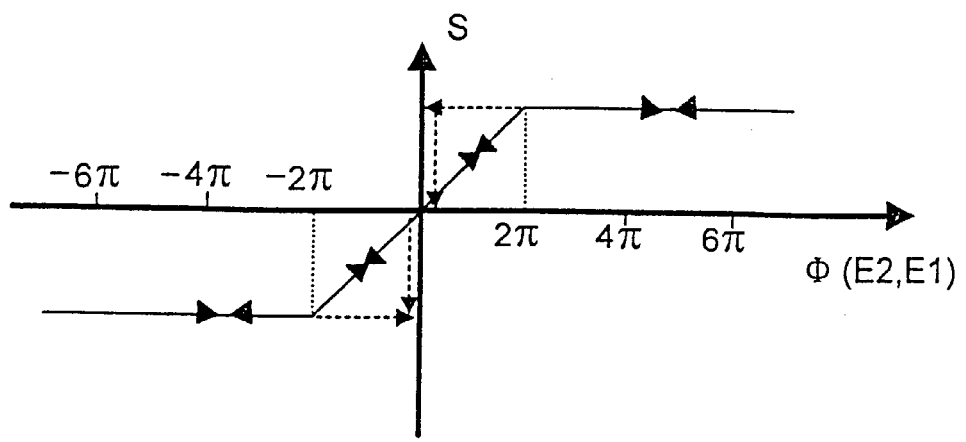
FIG. 6 represents the discriminator response curve.

Thus, it is taken into account that when the frequencies of the signals are different, the signals QQ1 and QQ2 remain constant, which makes it possible to have an error signal that causes the oscillator 35 (FIG. 2) to be synchronized fast. This is diagrammatically shown in FIG. 6, which shows the response of the discriminator of FIG. 3, that is, the variation of the signal S as a function of the phase error and/or frequency error of the signals E1 & E2 Φ(E1, E2). It will be noted that there is a hysteresis effect involved. Actually, if the frequencies are close together, the signals QQ1 and QQ2 do not change value. For making this obvious, FIG. 5 shows that the edges 18 and 19 no longer occur, the signals Q1 and Q2 thus keep the "0" value (dotted curve) which provides that neither of the flip-flops 61 and 62 changes state. When phase coincidence is reached, the solid-line curve of FIG. 6 is described.

It is possible to realize the circuits of the invention in a different manner. For example, by using logic circuits coupled to memory elements.

What is claimed is:

1. A radio device comprising a frequency synthesizer that includes a phase discriminator for comparing the phase of a first signal with the phase of a second signal, the phase discriminator being formed by first and second sequential circuits each including a JK flip-flop for producing output signals that represent the phase difference between said first and second signals, said second sequential circuit produces a constant amplitude when said first and second signals have different frequencies.

2. A device as claimed in claim 1, characterized in that said second sequential circuit is formed by an additional flip-flop that has a clock input for receiving the first signal, and a logic circuit configured to provide control signal for resetting said additional flip-flop in a stable state for different frequencies of said first and second signals.

3. A device as claimed in claim 1, in which the discriminator includes a current pump circuit that is coupled to said first and second sequential circuits and has a control input for receiving logic signals, characterized in that said phase discriminator further includes a coupling circuit in between said current pump circuit and said first and second sequential circuits for supplying control signals to said control input, first values of said control signals being defined by said second sequential circuit when said first and second signals have different frequencies and second values of said control signals being defined by said first sequential circuit when said first and second signals have phase coincidence.

4. A phase discriminator comprising:
a first logic device and a second logic device, said first logic device and said second logic device receiving a first signal having a first frequency;
a third logic device and a fourth logic device, said third logic device and said fourth logic device receiving a second signal having a second frequency, wherein said second logic and said fourth logic device are JK flip-flops; and
a fifth logic device which is configured to feed back combined outputs of said first logic device and said third logic device to reset inputs of said first logic device and said third logic device so that outputs of said second logic device and said fourth logic device have an amplitude that remains constant when said first frequency is different from said second frequency.

5. The phase discriminator of claim 4, further comprising:
a sixth logic device which receives an output of said first logic device and an output of said second logic device;
a seventh logic device which receives an output of said third logic device and an output of said fourth logic device; and
a current pump that receives outputs of said sixth logic device and said seventh logic device and outputs a signal having a value that remains constant when said first frequency is different from said second frequency.

6. The phase discriminator of claim 5, wherein said sixth logic device and said seventh logic device are OR gates.

7. The phase discriminator of claim 4, wherein said fifth logic device is a NAND gates.

8. The phase discriminator of claim 4, wherein said first logic device and said third logic device are D flip-flops.

9. A radio device comprising:

an antenna;

a duplexer connected to said antenna;

a transceiver connected to said duplexer; and a frequency synthesiser connected to said transceiver, said frequency synthesiser including a phase discriminator which comprises:
- a first logic device and a second logic device, said first logic device and said second logic device receiving a first signal having a first frequency;
- a third logic device and a fourth logic device, said third logic device and said fourth logic device receiving a second signal having a second frequency, wherein said second logic and said fourth logic device are JK flip-flops; and
- a fifth logic device which is configured to feed back combined outputs of said first logic device and said third logic device to reset inputs of said first logic device and said third logic device so that outputs of said second logic device and said fourth logic device have an amplitude that remains constant when said first frequency is different from said second frequency.

10. The radio device of claim 9, further comprising:

a sixth logic device which receives an output of said first logic device and an output of said second logic device;

a seventh logic device which receives an output of said third logic device and an output of said fourth logic device; and a current pump that receives outputs of said sixth logic and said seventh logic device and outputs a DC signal when said first frequency is different from said second frequency.

11. The radio device of claim 9, wherein said sixth logic device and said seventh logic device are OR gates.

12. The radio device of claim 9, wherein said fifth logic device is a NAND gates.

13. The radio device of claim 9, wherein said first logic device and said third logic device are D flip-flops.

* * * * *